United States Patent [19]

Kuo

[11] 4,386,286
[45] May 31, 1983

[54] HIGH CURRENT STATIC MOS OUTPUT BUFFER CIRCUIT FOR POWER-DOWN MODE OF OPERATION

[75] Inventor: Chang-Kiang Kuo, Austin, Tex.

[73] Assignee: Texas Instruments Incorporated, Dallas, Tex.

[21] Appl. No.: 110,288

[22] Filed: Jan. 7, 1980

[51] Int. Cl.³ .................. H03K 17/04; H03K 17/687; G01C 8/00
[52] U.S. Cl. .................................. 307/581; 307/583; 365/227
[58] Field of Search ................................. 307/448–450, 307/463, 481, 581, 583, 446, DIG. 5; 365/177, 226–228

[56] References Cited

U.S. PATENT DOCUMENTS 3,541,543 11/1970 Crawford et al. ................ 307/463
4,051,388 9/1977 Inukai ............................... 307/449

OTHER PUBLICATIONS

Delahanty et al., "Depletion–Mode FET Load Devices Switched with Positive Signal Voltage", IBM Tech. Disc. Bull., 12/76, p. 2612.

Scarpero, Jr., W. J., "Field–Effect Transistor Bidirectional Driver Control Circuit", IBM Tech. Disc. Bull., 1/74, pp. 307/751.

Craig et al., "Cross–Coupled FET Driver Circuit", IBM Tech. Disc. Bull., 5/75, p. 3538.

Primary Examiner—William H. Punter
Attorney, Agent, or Firm—John G. Graham

[57] ABSTRACT

A static push-pull driver circuit employs an enhancement mode transistor and a low threshold "natural" transistor as its push-pull output, and two parallel gating transistors in the driver circuit for the low-threshold transistor. One of the gating transistors is also a low-threshold natural transistor, and the other is a much smaller depletion mode transistor. The depletion transistor may be formed in the channel area of the other gating transistor by an ion implant. The common gate of the two gating transistors is connected to a chip select signal.

16 Claims, 5 Drawing Figures

HIGH CURRENT STATIC MOS OUTPUT BUFFER CIRCUIT FOR POWER-DOWN MODE OF OPERATION

BACKGROUND OF THE INVENTION

This invention relates to semiconductor circuits and more particularly to static driver circuits of the type useful as outputs for semiconductor memory devices or the like.

In static semiconductor memory devices of the RAM, ROM or EPROM type, a power-down mode of operation is often used. A chip-select power-down mode is now commonly used. Usually, a gating transistor is connected in series with each key inverter that draws direct current, with the gates of all gating transistors connected to a chip-select CS signal so that these transistors will be turned off when the chip is not selected or CS is not active. In the typical push-pull output buffer circuit used in this type of device, when a single +5 V supply is employed, a problem arises because the output level for a logic 1 is a two Vt drop from the Vcc supply due the threshold voltages of the output transistor and its gating transistor. This output level is often marginal for achieving a 2.4 V TTL level specification under a source current of 400 microamp. In order to minimize the Vt drop, the output and gating transistors are constructed as "natural" transistors with a Vt of typically 0 to +0.3 V. Even at this low Vt, the output "1" level is still marginal because of increase net Vt due to body effect.

It is therefore the principal object of this invention to provide an improved static driver circuit, particularly one that is adapted for low power dissipation and has a low voltage drop. Another object is to provide a push-pull MOS output circuit which has high speed and is adapted for a power-down mode of operation with low power dissipation, yet produces a full logic level output voltage.

SUMMARY OF THE INVENTION

In accordance with an embodiment of the invention, a static push-pull driver circuit employs an enhancement mode transistor and a low threshold "natural" transistor as its push-pull output, and two parallel gating transistors in the driver circuit for the low-threshold transistor. One of the gating transistors is also a low-threshold natural transistor, and the other is a much smaller depletion mode transistor. The depletion transistor may be formed in the channel area of the other gating transistor by an ion implant. The common gate of the two gating transistors is connected to a chip select signal.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
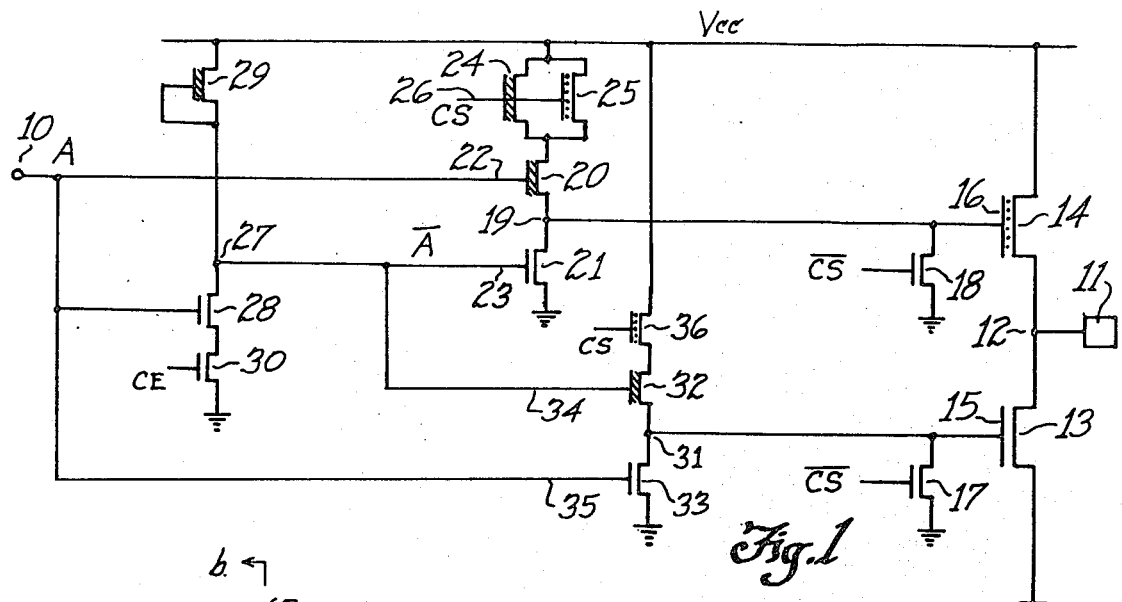
FIG. 1 is an electrical schematic diagram of a circuit according to the invention.

Referring to FIG. 1, a circuit according to the invention is illustrated. This is a static type output buffer used in a semiconductor memory device having a power down mode of operation. An input signal A on line 10 may be either a logic 1, near Vcc, or a logic 0 at Vss, and produces either a logic 1 or logic 0 on an output pad 11. The output pad 11 is connected to a node 12 between two large transistors 13 and 14 which are connected between Vcc and Vss or ground. The transistor 13 is an enhancement mode device having a threshold of about +0.8 V, while the transistor 14 is a natural or low-threshold device with a threshold of perhaps +0.2 V. The gates 15 and 16 (or control electrodes) of the push-pull output transistors 13 and 14 are connected to ground via transistors 17 and 18, respectively, which have $\overline{CS}$ on their gates; in this manner, when the chip is in a power down mode and chip select CS is low, the $\overline{CS}$ signal is high and both of the gates 15 and 16 are clamped at Vss, holding both transistors 13 and 14 off and the pad 11 in a high impedance state. With CS high ($\overline{CS}$ low) the circuit is functional; when A is high, gate 16 is high and gate 15 low, so the transistor 14 is on and transistor 13 off, producing a logic 1 on the output pad 11; when A is low, the opposite conditions exist and a logic 0 is on the output pad 11. The gate 16 of the transistor 14 is connected to a node 19 which is the output of a stage having a depletion mode transistor 20 on one side and an enhancement mode transistor 21 on the other. The gate 22 of the transistor 20 is connected to receive the A input from the input terminal 10, while the gate 23 of the transistor 21 receives the complement $\overline{A}$ of the input via an inverter stage. As will be explained, according to a primary feature of the invention a pair of parallel transistors 24 and 25 are connected in series with the transistors 20 and 21; the transistor 24 is a depletion mode device and the transistor 25 is a "natural" or unimplanted low-threshold enhancement mode transistor. Both of these transistors have the chip select signal CS on their common gate (or control electrodes) 26.

In summary, the circuit comprises a large output transistor 14 having a control electrode 16 with the current path of the transistor 14 connected between voltage supply Vcc and output node 12, along with a pair of transistors 24 and 25 having a common gate 26 and having parallel current paths connected (via transistor 20) between voltage supply Vcc and gate 16; of the pair of transistors 24 and 25, one has a threshold voltage of the polarity of the voltage supply Vcc and the other has a threshold voltage which is zero or a small voltage of the opposite polarity. Said transistors 14, 24 and 25 are N-channel field effect transistors, and the current paths are source-to-drain paths. The transistor 14 has a threshold voltage of about the same magnitude as that of one of said pair of transistors 24 and 25. A second output transistor 13 has a current path in series with that of transistor 14, and has a threshold voltage substantially greater than that of said one of the pair of transistors 24 and 25. The gates 26 for the pair of transistors 24 and 25 are connected to a chip select voltage CS which is high when the circuit is selected and is zero when the circuit is not selected or is in a power down mode.

The gate 23 of the transistor 21 is connected to the output 27 of an inverter having a driver transistor 28 and a depletion load 29. An enhancement mode transistor 30 in series with the inverter has the chip enable clock CE on its gate, so the circuit is clamped in the condition with the transistor 14 off when CE is low, because the gate 23 is unconditionally high and the gate 16 unconditionally low. The input A from terminal 10 is connected to the gate of the driver transistor 28.

The gate 15 of the transistor 13 is connected to an output 31 of a stage which has a depletion mode transistor 32 on one side and an enhancement mode transistor 33 on the other. The gate 34 of the transistor 32 is connected to receive the $\overline{A}$ output 23 of the inverter, while the gate 35 of the transistor 33 receives the A input from the terminal 10. A natural transistor 36 in series with this stage has the chip select CS on its gate, so when CS is low the Vcc voltage is blocked from reaching the gate 15, avoiding a direct current path to ground through the transistor 17.

According to the invention, improved operation is due to the combination of a depletion transistor 24 in parallel with the natural transistor 25 which allows the Vcc voltage to be applied directly (full value) to the gate 16 of the transistor 14, thus improving the logic 1 level on the output 11 by one Vt. The source current capacity for the transistor 14 is also increased. Since the transistor 24 will contribute to standby current from Vcc to Vss through transistor 18, transistor 24 being a depletion mode device, the size of the transistor 24 is smaller than transistor 25 to meet the low standby current requirement. Also during the standby mode of operation, the transistor 24 is still conducting, even though at a smaller gate drive. The transistor 24 must be small enough such that the voltage on the gate 16 is not high enough to cause any conduction current in transistor 14 which is also a natural transistor having a very low threshold.

Figure 2:
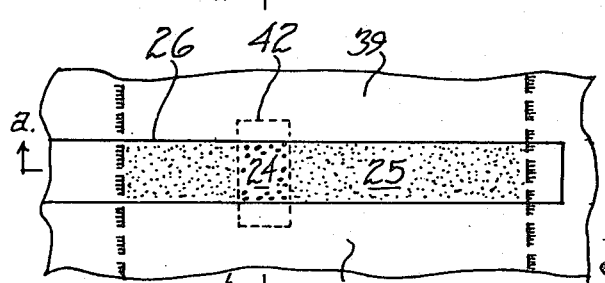
FIG. 2 is a greatly enlarged plan view of a small part of a semiconductor integrated circuit including two of the transistors in the circuit of FIG. 1.
Figure 2B:
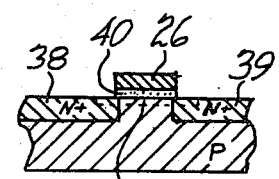
FIGS. 2a and 2b are sectional views of the device of FIG. 2, taken along the lines a—a and b—b in FIG. 2.
Figure 2A:
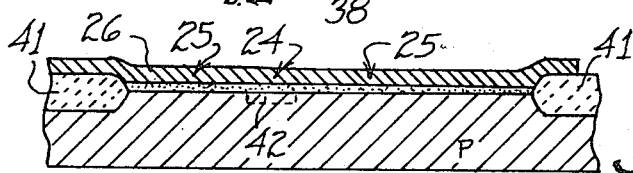
Figure 3:
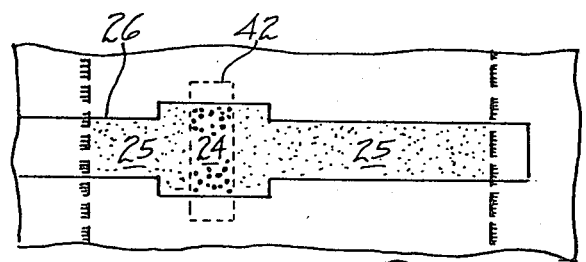
FIG. 3 is a view as in FIG. 2 for an alternative embodiment.

The transistor 24 is very easily implemented in a new design or an existing design to upgrade circuit performance. A layout of the transistors 24 and 25 in an integrated circuit chip is seen in FIG. 2 along with sectional views of FIGS. 2a and 2b. The common gate 26 is a polysilicon strip crossing a moat area, with N+ source and drain regions 38 and 39 formed using the polysilicon and gate oxide 40 as a mask. Field oxide 41 surrounds the moat. A small phosphorus implanted area 42 is created in the wide channel area of the transistor 25, lowering the threshold for this part to a little below zero volts. This implant is done just before or just after the usual boron implant which adjust the threshold of the enhancement transistors 13,18,21, etc. Preferably, the area 42 is centrally located along the width of the channel of the transistor 25, away from the edges, to totally remove the effect of sizing change of transistor 24 due to misalignment. Another embodiment is shown in FIG. 3, where the polysilicon strip 26 for the gate of the transistor 24 is expanded in the vacinity of the implant area 42 to reduce the short channel effect of a depletion device.

It has been shown by analysis that the transistor 24 improves the output voltage level by about 0.5 V for a typical N-channel device using 5 V for Vcc. This is quite significant. The added transistor 24 will also improve the speed of a 5 V circuit because of the faster pull up and higher voltage of the gate 16 of transistor 14. Another advantage of the invention is that since the transistor 14 has a higher gate voltage its device size can be reduced to provide a given source current capability. Reduction of the size of transistor 14 reduces layout area and can also further improve speed because of reduced loading for the previous stage.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed:

1. In a circuit having an output transistor including a current path and a control electrode, a circuit input coupled to said control electrode to turn said current path on and off, an output node, and means connecting the current path of the output transistor between a voltage supply and said output node, the improvement comprising: a pair of transistors having parallel current paths and a common control electrode, means connecting said parallel current paths between said voltage supply and said control electrode of said output transistor, one of said pair of transistors having a threshold voltage of the polarity of said voltage supply and the other having a threshold voltage which is zero or a small voltage of the opposite polarity.

2. A circuit according to claim 1 wherein said transistors are N-channel field effect transistors, the current paths are source-to-drain paths, and said control electrodes are gates.

3. A circuit according to claim 2 wherein said output transistor has a threshold voltage of about the same magnitude and polarity as that of the threshold voltage of said one of said pair of transistors.

4. A circuit according to claim 3 wherein a second output transistor has a current path connected in parallel series with that of said output transistor and has a threshold voltage substantially of the same polarity and greater than that of the threshold voltage of said one of said pair of transistors.

5. A circuit according to claim 3 wherein the gates of said pair of transistors are connected to a "chip select" voltage which is high when the circuit is in a selected mode and is zero when the circuit is in a not-selected mode and also is zero when the circuit is in a power-down mode.

6. A circuit according to claim 5 wherein said pair of transistors share common channel, source and drain areas in a face of a semiconductor body, except that the area of the channel of said one of the pair of transistors is implanted to provide depletion mode operation.

7. A circuit according to claim 6 wherein said one of said pair of transistors has a channel width much smaller than said other of said pair.

8. A circuit according to claim 7 wherein said implant area of said one of the pair of transistors is centrally located in the channel of said other of the pair of transistors.

9. A circuit according to claim 1 wherein another transistor has a current path connected between the control electrode of said output transistor and reference potential and has a control electrode connected to the complement of the signal which is on the common control electrodes of said pair of transistors.

10. In a circuit having an input, a first output transistor and a second output transistor, each output transistor having a current path and a control electrode, an output node, means connecting the current path of the first output transistor in series between a voltage supply and said output node, means connecting the current path of the second output transistor between said output node and reference potential, and circuit input means for coupling said input to the control electrode of one of the first and second output transistors and coupling the complement of said input to the control electrode of the other of said first and second output transistors, the improvement comprising a pair of transistors having parallel current paths and a common control electrode, means connecting said parallel current paths between said voltage supply and said control electrode of said first output transistor, one of said pair of transistors having a threshold voltage of the polarity of said voltage supply and the other having a threshold voltage which is zero or a small voltage of the opposite polarity.

11. A circuit according to claim 10 wherein said first and second output transistors and said pair of transistors are all insulated-gate field effect transistors, the current paths are source-to-drain paths, and said control electrodes are gates.

12. A circuit according to claim 11 wherein said first output transistor has a threshold voltage of about the same magnitude and polarity as that of the threshold voltage of said one of said pair of transistors.

13. A circuit according to claim 12 wherein said second output transistor has a threshold voltage substantially of the same polarity and greater in magnitude than the threshold voltage of said one of said pair of transistors.

14. A circuit according to claim 11 wherein the gates of said pair of transistors are connected to a "chip select" voltage which is high when the circuit is in a selected mode and is zero when the circuit is in a not-selected mode and also is zero when the circuit is in a power-down mode.

15. A circuit according to claim 11 wherein said pair of transistors share common channel, source and drain areas in a face of a semiconductor body, except that the area of the channel of said one of the pair of transistors is implanted to provide depletion mode operation.

16. A circuit according to claim 11 including third and fourth transistors each having a current path connected between the control electrode of one of said first and second output transistors respectively and reference potential, and each of the third and fourth transistors has a control electrode connected to the complement of the signal which is on the common control electrodes of said pair of transistors.

* * * * *